United States Patent
Bando et al.

(10) Patent No.: US 7,009,304 B2
(45) Date of Patent: Mar. 7, 2006

(54) RESIN-SEALED SEMICONDUCTOR DEVICE

(75) Inventors: Koji Bando, Tokyo (JP); Hideki Ishii, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/981,472

(22) Filed: Nov. 5, 2004

(65) Prior Publication Data

US 2005/0082689 A1 Apr. 21, 2005

Related U.S. Application Data

(62) Division of application No. 10/348,015, filed on Jan. 22, 2003.

(30) Foreign Application Priority Data

Apr. 24, 2002 (JP) .............................. 2002-121871

(51) Int. Cl.
*H01L 29/40* (2006.01)
(52) U.S. Cl. ...................................... 257/777; 257/676
(58) Field of Classification Search ................ 257/723, 257/777, 666, 676
See application file for complete search history.

(56) References Cited

U.S. PATENT DOCUMENTS

| | | | |
|---|---|---|---|
| 5,818,105 A * | 10/1998 | Kouda | ......................... 257/696 |
| 6,414,385 B1 | 7/2002 | Huang et al. | |
| 6,680,531 B1 * | 1/2004 | Hsu et al. | ..................... 257/723 |
| 6,696,750 B1 | 2/2004 | Yin et al. | |
| 2001/0045644 A1 | 11/2001 | Huang | |
| 2002/0180020 A1 * | 12/2002 | Lin et al. | ..................... 257/686 |

FOREIGN PATENT DOCUMENTS

| | | |
|---|---|---|
| JP | 06-188333 | 7/1994 |
| JP | 07-29925 | 1/1995 |
| JP | 11-68016 | 3/1999 |
| JP | 2001-358286 A | 12/2001 |
| KR | 2000-0044989 | 7/2000 |

* cited by examiner

Primary Examiner—Roy Potter
(74) Attorney, Agent, or Firm—McDermott Will & Emery LLP

(57) ABSTRACT

A resin-sealed semiconductor device has a first semiconductor chip whose circuit surface is bonded to a surface of a die pad. The back surface of a second semiconductor chip is bonded to the back surface of the first semiconductor chip. Each of the semiconductor chips is connected by wire to outer lead respectively. A sealing resin is provided for encapsulating the die pad, the first and second semiconductor chips and the wires so that the other surface of the die pad is exposed.

5 Claims, 3 Drawing Sheets

RESIN-SEALED SEMICONDUCTOR DEVICE

This is a divisional of application Ser. No. 10/348,015 filed Jan. 22, 2003.

BACKGROUND OF THE INVENTION

1. Field of the Invention

The present invention relates to a resin-sealed semiconductor device, and more specifically to a resin-sealed semiconductor device comprising a plurality of semiconductor chips.

2. Background Art

FIG. 8 is a sectional view schematically showing a resin-sealed semiconductor device comprising two semiconductor chips as an example of conventional multi-chip package i.e. MCP.

In FIG. 8, reference numeral 1 denotes a die pad that hold semiconductor chips; 2 denotes a first semiconductor chip whose back is bonded with an insulating adhesive 3 on a surface, i.e. the upper surface in FIG. 8, of the die pad 1; 4 denotes a second semiconductor chip whose back is bonded with the insulating adhesive 3 on the other surface, i.e. the lower surface in FIG. 8, of the die pad 1; 5 denotes outer leads for connecting the first semiconductor chip 2 and second semiconductor chip 4 to external circuits (not shown); 6 denotes wires for connecting the circuit surface of the first semiconductor chip 2 with the outer leads 5; 7 denotes wires for connecting the circuit surface of the second semiconductor chip 4 with the outer leads 5; and 8 denotes a sealing resin for encapsulating the die pad 1, the first semiconductor chip 2, the second semiconductor chip 4, wires 6 and 7, and the inner ends of the outer leads 5 as shown in FIG. 8.

FIG. 9 is a sectional view schematically showing a resin-sealed semiconductor device comprising three semiconductor chips. This semiconductor device is constituted of a first semiconductor chip 2 and a second semiconductor chip 4 of the same size as in FIG. 8, and furthermore, a third semiconductor chip 9 whose back is bonded to the circuit surface of the first semiconductor chip 2 through an insulating adhesive 3. The third semiconductor chip 9 is connected to the outer leads 5 with wires 10, and the semiconductor chips 2, 4, 9 and wires 6, 7, 10 are sealed with a sealing resin 8 as shown in FIG. 9.

Conventional MCPs are constituted as described above, and in a semiconductor device comprising two semiconductor chips as shown in 10 FIG. 8, since the thickness of each semiconductor chip is about 0.2 mm, the total height Ha from the bottom of the outer leads 5 to the top of the sealing resin 8 is 0.9 to 1.2 mm. However, if the thicknesses of the sealing resin 8 in the upper and lower sides are reduced to meet the requirements of thickness reduction, the problem that the wires 15 6 and 7 are exposed on the surface of the package arises. Also, in the semiconductor device comprising three semiconductor chips as shown in FIG. 9, although the total height Hb from the bottom of the outer leads 5 to the top of the sealing resin 8 is made 0.9 to 1.2 mm as in the case of FIG. 8, by reducing the thickness of each semiconductor 20 chip to as thin as 0.09 to 0.15 mm, the reduction of the thickness of the device by reducing the thickness of each component has a problem of the presence of limitation on manufacturing.

Therefore, the object of the present invention is to solve the above-described problems, and to provide a resin-sealed semiconductor device that enables the total height to be reduced without reducing the thickness of each component.

SUMMARY OF THE INVENTION

According to one aspect of the present invention, a resin-sealed semiconductor device has a die pad and a first semiconductor chip whose circuit surface is bonded to one surface of the die pad. The back surface of a second semiconductor chip is bonded to the back surface of the first semiconductor chip. Wires are provided for connecting each of the semiconductor chips to outer leads. Further, a sealing resin is provided for encapsulating the die pad, the first and second semiconductor chips and the wires so that the other surface of the die pad is exposed.

According to another aspect of the present invention, a resin-sealed semiconductor device has a die pad and a first semiconductor chip whose circuit surface is bonded to one surface of the die pad. The circuit surface, i.e. the front surface, of a second semiconductor chip is bonded to the back of the first semiconductor chip. Wires are provided for connecting each of the semiconductor chips to outer leads. Further, a sealing resin is provided for encapsulating the die pad, the first and second semiconductor chips and the wires so that the other surface of the die pad and the back of the second semiconductor chip are exposed.

Other features and advantages of the invention will be apparent from the following description taken in connection with the accompanying drawings.

DETAILED DESCRIPTION OF THE PREFERRED EMBODIMENTS

First Embodiment

Figure 1:
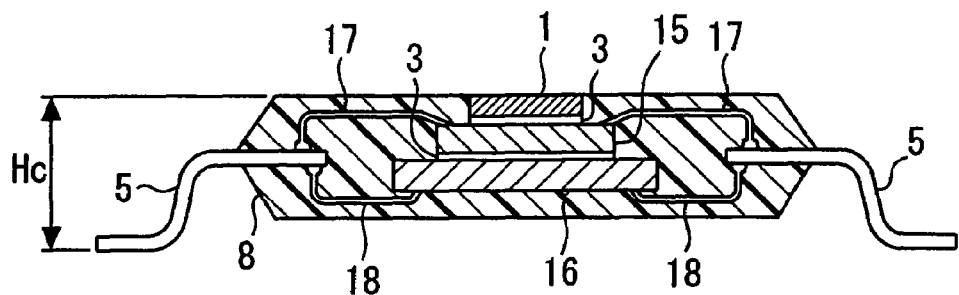
FIG. 1 is a sectional view schematically showing the constitution of First Embodiment, and shows an example of the case where two semiconductor chips are mounted.

First Embodiment of the present invention will be described below referring to the drawing. FIG. 1 is a sectional view schematically showing the constitution of First Embodiment, and shows an example of the case where two semiconductor chips are mounted. In FIG. 1, reference numeral 1 denotes a die pad for holding semiconductor chips, 15 denotes a first semiconductor chip whose circuit, surface is bonded with an insulating adhesive 3, such as a polyimide tape and an epoxy-based resin, on a surface, i.e. the lower surface in FIG. 1, of the die pad 1; 16 denotes a second semiconductor chip whose back is bonded with the insulating adhesive 3 on the back of the first semiconductor chip 15; 5 denotes outer leads for connecting the first semiconductor chip 15 and second semiconductor chip 16 to external circuits (not shown); 17 denotes wires for connecting the circuit surface of the first semiconductor chip 15 with the outer leads 5; 18 denotes wires for connecting the circuit surface of the second semiconductor chip 16 with the outer leads 5; and 8 denotes a sealing resin for encapsulating the die pad 1, the first semiconductor chip 15, the second semiconductor chip 16, wires 17 and 18, and the inner ends of the outer leads 5 in the state where the other surface of the die pad 1 is exposed as shown in FIG. 1.

According to First Embodiment, which is constituted as described above, the circuit surface of the first semiconductor chip 15 can be protected from the environment by bonding the circuit surface of the first semiconductor chip 15 to a surface of the die pad 1; and the total thickness of the semiconductor device can be thinned by exposing the other surface of the die pad 1 to the environment. In the case of FIG. 1, the total height Hc from the bottom of the outer lead 5 to the upper surface of the sealing resin 8, that is, the other surface of the die pad 1, becomes 0.7 mm.

Second Embodiment

Figure 2:
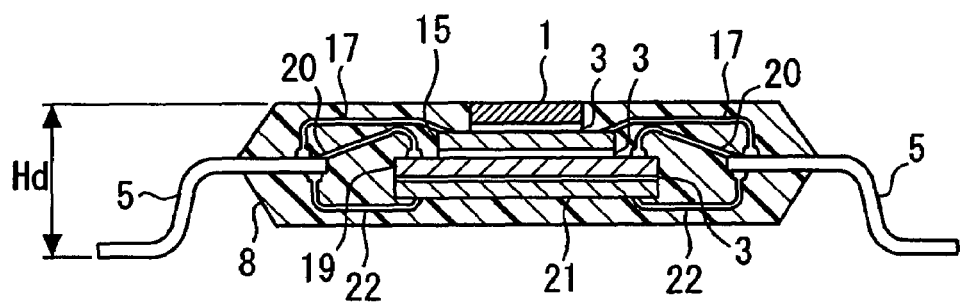
FIG. 2 is a sectional view schematically showing the constitution of Second Embodiment, and shows an example of the case where three semiconductor chips are mounted.

Next, Second Embodiment of the present invention will be described below referring to the drawing. FIG. 2 is a sectional view schematically showing the constitution of Second Embodiment, and shows an example of the case where three semiconductor chips are mounted. In FIG. 2, the same or corresponding parts shown in FIG. 1 are denoted by the same reference numerals, and the description thereof will be omitted. What is different from the semiconductor device shown in FIG. 1 is that the circuit surface of the second semiconductor chip 19 is bonded to the back of the first semiconductor chip 15 with an insulating adhesive 3, the circuit surface of the second semiconductor chip 19 is connected to outer leads 5 with wires 20, the back of the third semiconductor chip 21 is bonded to the back of the second semiconductor chip 19 with the insulating adhesive 3, and the circuit surface of the third semiconductor chip 21 is connected to outer leads 5 with wires 22.

Figure 9:
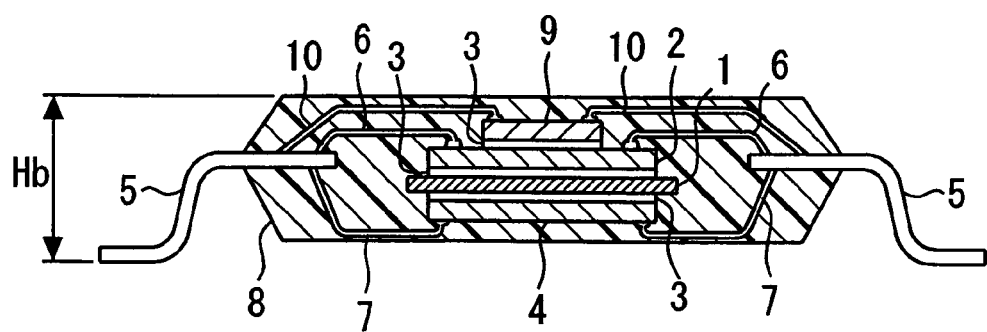
FIG. 9 is a sectional view schematically showing a conventional resin-sealed semiconductor device comprising three semiconductor chips.

According to Second Embodiment, which is constituted as described above, the total height Hd from the bottom of the outer lead 5 to the other surface of the die pad 1 becomes 0.7 mm as in the semiconductor device shown in FIG. 1 by thinning the thickness of semiconductor chips 15, 19, and 21 to 0.09 to 0.15 mm as in the case of FIG. 9, and by exposing the other surface of the die pad 1.

Figure 3:
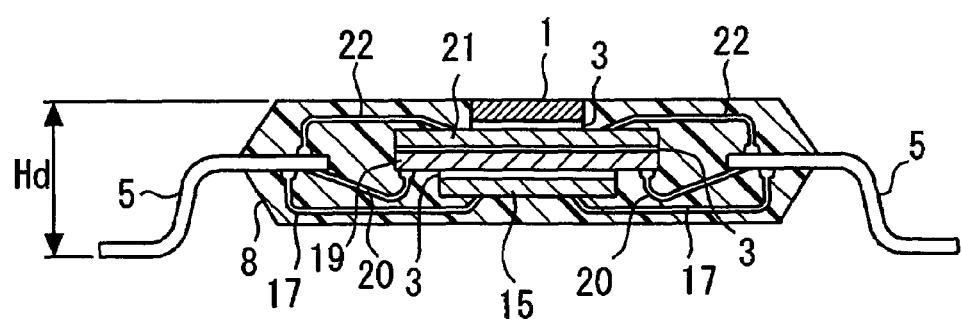
FIG. 3 is a sectional view schematically showing the modification of the constitution in Second Embodiment.
Figure 4:
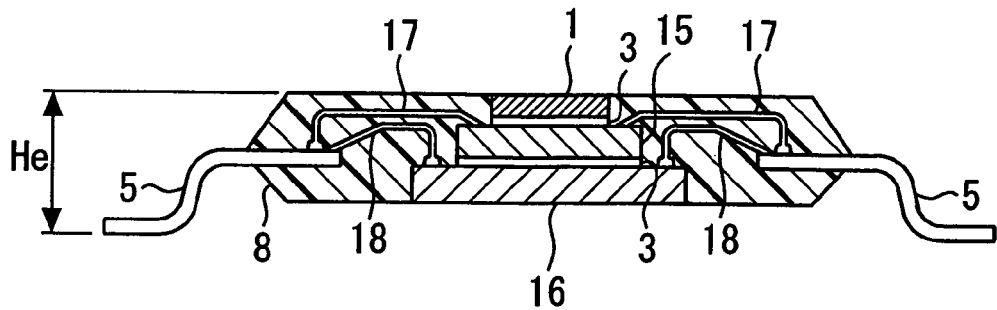
FIG. 4 is a sectional view schematically showing the constitution of Third Embodiment, and shows another example of the case where two semiconductor chips are mounted.

Alternatively, the first semiconductor chip 15, the second semiconductor chip 19, and the third semiconductor chip 21 can be made upside down in the connected state of FIG. 2, and the circuit surface of the third semiconductor chip 21 can be bonded to a surface of the die pad 1 with an insulating adhesive 3 as FIG. 3 shows. In this case, the total Hd is unchanged Third Embodiment Next, Third Embodiment of the present invention will be described below referring to the drawing. FIG. 4 is a sectional view schematically showing the constitution of Third Embodiment, and shows another example of the case where two semiconductor chips are mounted. In FIG. 4, the same or corresponding parts shown in FIG. 1 are denoted by the same reference numerals, and the description thereof will be omitted. What is different from the semiconductor device shown in FIG. 1 is that the circuit surface of the second semiconductor chip 16 in FIG. 1 is bonded to the back of the first semiconductor chip 15 with an insulating adhesive 3, and the back of the second semiconductor chip 16 is also exposed to the environment.

Even if the second semiconductor chip 16 is exposed to the environment, the reliability of the device is not affected.

By such a constitution, the total height He from the bottom of the outer lead 5 to the other surface of the die pad 1 becomes 0.5 mm, and the device can be further thinned compared with the device of FIG. 1.

Fourth Embodiment

Figure 5:
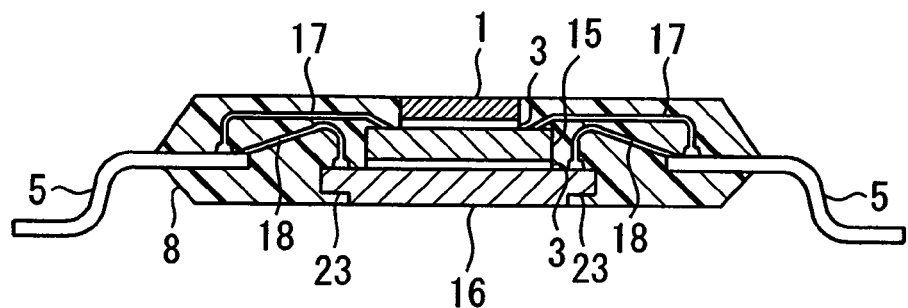
FIG. 5 is a sectional view schematically showing the constitution of Fourth Embodiment.

Next, Fourth Embodiment of the present invention will be described below referring to the drawing. FIG. 5 is a sectional view schematically showing the constitution of Fourth Embodiment. In FIG. 5, the same or corresponding parts with those shown in FIG. 4 are denoted by the same reference numerals, and the description thereof will be omitted. What is different from the semiconductor device shown in FIG. 4 is that a step or cut-off is formed on the entire circumference of the back of the second semiconductor chip 16 in FIG. 4. In FIG. 5, reference numeral 23 is the step formed on the entire circumference of the back of the second semiconductor chip 16, and has the size in the vertical direction in FIG. 5 of about 50 $\mu$m, and the size in the horizontal direction of about 100 $\mu$m. The step 23 is formed using etching or dicing.

The step 23 is formed for improving the adhesion of the sealing resin 8 to the second semiconductor chip 16, because if foreign matter adheres on the side of the second semiconductor chip 16 in FIG. 4 in the manufacturing process, sufficient adhesion to the sealing resin 8 cannot be secured.

Fifth Embodiment

Figure 6:
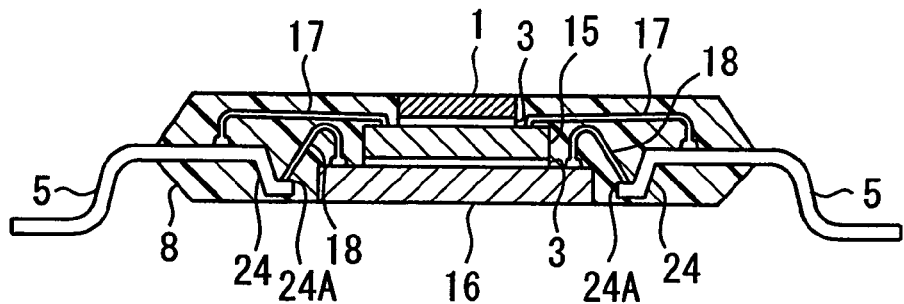
FIG. 6 is a sectional view schematically showing the constitution of Fifth Embodiment.

Next, Fifth Embodiment of the present invention will be described below referring to the drawing. FIG. 6 is a sectional view schematically showing the constitution of Fifth Embodiment. In FIG. 6, the same or corresponding parts with those shown in FIG. 4 are denoted by the same reference numerals, and the description thereof will be omitted. What is different from the semiconductor device shown in FIG. 4 is that the inner ends of outer leads 5 are bent to a substantially L-shape. In FIG. 6, reference numeral 24 is substantially L-shaped bent portions formed on the inner ends of the outer leads 5, and are formed when the process margin is insufficient when the circuit surface of the second semiconductor chip 16 in FIG. 4 is connected to the outer leads with wires 18. The process margin can be increased by forming a L-shaped bent portion 24 and by connecting the wires 18 to the ends 24A of the L-shaped bent portions 24.

Sixth Embodiment

Figure 7:
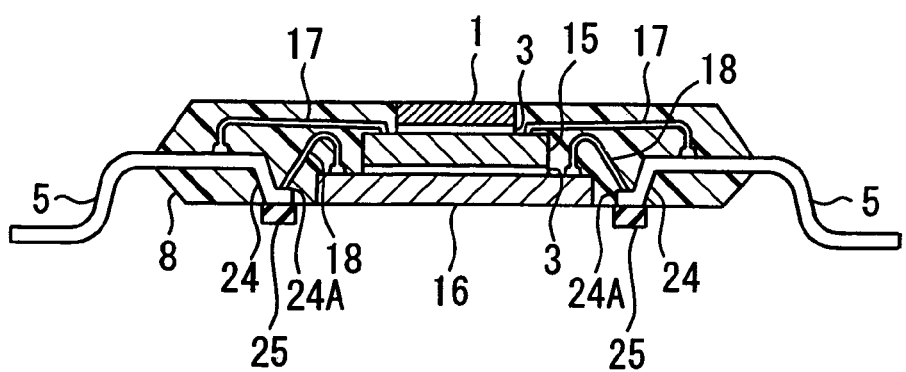
FIG. 7 is a sectional view schematically showing the constitution of Sixth Embodiment.
Figure 8:
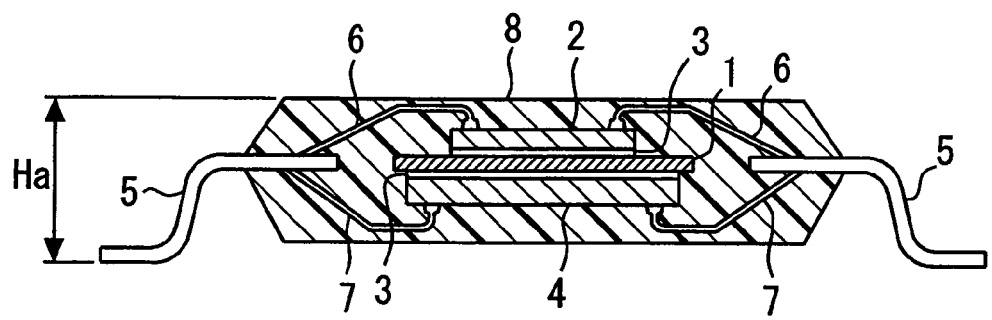
FIG. 8 is a sectional view schematically showing a conventional resin-sealed semiconductor device comprising two semiconductor chips.

Next, Sixth Embodiment of the present invention will be described below referring to the drawing. FIG. 7 is a sectional view schematically showing the constitution of Sixth Embodiment. In FIG. 7, the same or corresponding parts with those shown in FIG. 6 are denoted by the same reference numerals, and the description thereof will be omitted. What is different from the semiconductor device shown in FIG. 6 is that the back of the ends 24A of the L-shaped bent portions 24 are exposed to the environment, and terminals 25 are formed on the exposed portions for connecting to external circuits. Even if the back of the ends 24A of the L-shaped bent portions 24 are exposed to the environment, the reliability of the device is not affected.

By such a constitution, the outer leads can be connected easily to other circuits, and wiring becomes reliable.

The features and the advantages of the present invention may be summarized as follows.

In one aspect, a resin-sealed semiconductor device according to the present invention comprises a first semiconductor chip whose circuit surface is bonded to a surface of a die pad. The back surface of a second semiconductor chip is bonded to the back surface of the first semiconductor chip. Wires are connecting each of the semiconductor chips to outer leads. Further, a sealing resin is provided for encapsulating the die pad, the first and second semiconductor chips, and the wires, and the other surface of the die pad is exposed. As a result, the size of the circuit can be reduced by combining two semiconductor chips, such as a memory and a microcomputer chip, or an SRAM and a flash memory, and the thickness of a highly integrated resin-sealed semiconductor device can be thinned.

In another aspect, a resin-sealed semiconductor device according to the present invention comprises a first semiconductor chip whose circuit surface is bonded to a surface of a die pad. The circuit surface of a second semiconductor chip is bonded to the back surface of the first semiconductor chip. The back surface of a third semiconductor chip is bonded to the back surface of the second semiconductor chip. Wires connect each of the semiconductor chips to outer leads. Further, a sealing resin is provided for encapsulating the die pad, the first, second, and third semiconductor chips, and the wires. The other surface of the die pad is exposed. As a result, three semiconductor chips can be packaged, and the thickness of a highly integrated resin-sealed semiconductor device can be thinned. Also, since two of the three semiconductor chips are bonded at the backs thereof, semiconductor chips of the same size can be used.

In another aspect, a resin-sealed semiconductor device according to the present invention comprises a first semiconductor chip whose circuit surface is bonded to a surface of a die pad. The back surface of a second semiconductor chip is bonded to the back surface of the first semiconductor chip. The back surface of a third semiconductor chip is bonded to the circuit surface of the second semiconductor chip. Wires connect each of the semiconductor chips to outer leads. Further, a sealing resin is provided for encapsulating the die pad, the first, second, and third semiconductor chips, and the wires so that the other surface of the die pad is exposed. As a result, three semiconductor chips can be packaged, and the thickness of a highly integrated resin-sealed semiconductor device can be thinned. Also, since two of the three semiconductor chips are bonded at the back surfaces thereof, semiconductor chips of the same size can be used.

In another aspect, a resin-sealed semiconductor device according to the present invention comprises a first semiconductor chip whose circuit surface is bonded to a surface of a die pad. The circuit surface of a second semiconductor chip is bonded to the back surface of the first semiconductor chip. Wires connect each of the semiconductor chips to outer leads. Further, a sealing resin is provided for encapsulating the die pad, the first and second semiconductor chips, and the wires so that the other surface of the die pad and the back of the second semiconductor chip are exposed. As a result, the thickness of a resin-sealed semiconductor device comprising two semiconductor chips can further be thinned.

In another aspect, a resin-sealed semiconductor device according to the present invention has a step or cut-off portion formed on a part of the back surface of the second semiconductor chip. Accordingly, even when foreign matter adheres to the side surface of the second semiconductor chip exposed to the environment during the manufacturing process, the sealing resin can be sufficiently adhered to the second semiconductor chip.

In another aspect, a resin-sealed semiconductor device according to the present invention, the inner ends of the outer leads are bent to a substantially L-shape. Accordingly, when the semiconductor chips are connected to the outer leads with wires, the process margin can be increased sufficiently.

In another aspect, a resin-sealed semiconductor device according to the present invention, the back of the ends bent to a substantially L-shape is allowed to expose from the sealing resin to be external terminals. Accordingly, the outer leads can be connected easily to other circuits, and wiring becomes reliable.

It is further understood that the foregoing description is a preferred embodiment of the disclosed device and that various changes and modifications may be made in the invention without departing from the spirit and scope thereof.

The entire disclosure of a Japanese Patent Application No. 2002-121871, filed on Apr. 24, 2002 including specification, claims, drawings and summary, on which the Convention priority of the present application is based, are incorporated herein by reference in its entirety.

What is claimed is:

1. A resin-sealed semiconductor device comprising:
    a first semiconductor chip having a circuit surface and a back surface opposing to each other;
    a die pad having a surface connected to said circuit surface of said first semiconductor chip;
    a second semiconductor chip having a circuit surface connected to said back surface of said first semiconductor chip, said second semiconductor chip having a back surface;
    wires for connecting each said circuit surface of said semiconductor chips to outer leads having inner ends; and
    a sealing resin for encapsulating said first semiconductor chip, said die pad, said other semiconductor chip and said wires so that the other surface of said die pad is exposed.

2. The resin-sealed semiconductor device according to claim 1, wherein a step is formed on a part of the back surface of said second semiconductor chip.

3. The resin-sealed semiconductor device according to claim 1, wherein the inner ends of said outer leads are bent to a substantially L-shape.

4. The resin-sealed semiconductor device according to claim 3, wherein a back portion of the inner ends bent to a substantially L-shape is exposed from said sealing resin to be external terminals.

5. The resin-sealed semiconductor device according to claim 1, further comprising:
    a third semiconductor chip having a circuit surface and an opposing back surface bonded to the back surface of said second semiconductor chip; and
    wires for connecting said third semiconductor chip to outer leads.

* * * * *